United States Patent
Janson et al.

(10) Patent No.: US 10,098,267 B1
(45) Date of Patent: Oct. 9, 2018

(54) HOUSING FOR A CAMERA AND METHOD OF MANUFACTURE

(71) Applicant: Robert Bosch LLC, Broadview, IL (US)

(72) Inventors: John Janson, Plymouth, MI (US); Ligor Manushi, Northville, MI (US); Alexander Moore, Ann Arbor, MI (US); Hiram Avalos, Detroit, MI (US); Robert Keller, Walled Lake, MI (US); Mark Ryskamp, Grosse Pointe Park, MI (US); Motozo Horikawa, Plymouth, MI (US)

(73) Assignees: Robert Bosch LLC, Broadview, IL (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/615,038

(22) Filed: Jun. 6, 2017

(51) Int. Cl.
| | |
|---|---|
| *G03B 17/02* | (2006.01) |
| *H05K 9/00* | (2006.01) |
| *H04N 5/225* | (2006.01) |
| *B60R 11/00* | (2006.01) |

(52) U.S. Cl.
CPC .......... *H05K 9/003* (2013.01); *H04N 5/2252* (2013.01); *H05K 9/0035* (2013.01); *H05K 9/0067* (2013.01); *B60R 11/00* (2013.01); *H05K 9/0015* (2013.01)

(58) Field of Classification Search
USPC ....................................................... 396/535
See application file for complete search history.

(56) References Cited

U.S. PATENT DOCUMENTS

| | | | |
|---|---|---|---|
| 6,628,130 B2 | 9/2003 | Williams et al. | |
| 6,874,954 B2 * | 4/2005 | Takagi | G02B 6/4204 372/6 |
| 7,965,514 B2 * | 6/2011 | Hill | H04M 1/0277 361/679.54 |
| 8,118,611 B2 | 2/2012 | Jeon | |
| 8,964,401 B2 | 2/2015 | Escamilla et al. | |
| 9,258,928 B2 | 2/2016 | Hill et al. | |
| 9,316,447 B2 | 4/2016 | Fleskens et al. | |
| 9,791,086 B2 * | 10/2017 | De Beer | F16L 53/008 |
| 2002/0111415 A1 * | 8/2002 | Mack, Sr. | C08K 7/06 524/496 |

(Continued)

FOREIGN PATENT DOCUMENTS

| | | |
|---|---|---|
| WO | 2001/047328 | 6/2001 |
| WO | 2015/117803 | 8/2015 |

(Continued)

*Primary Examiner* — Clayton E Laballe
*Assistant Examiner* — Warren K Fenwick
(74) *Attorney, Agent, or Firm* — Kelly McGlashen; Maginot Moore & Beck LLP

(57) ABSTRACT

An electronic device includes a housing, a printed circuit board (PCB) disposed in the housing, and electronic components that are supported on the PCB. The housing is an assembly of a cover and a base. At least one of the cover and the base include a region in which at least a portion of an outer surface of the housing within the region, and a portion of housing material adjoining the portion of the outer surface, have material properties that are different than those in other regions. A method of manufacturing that provides the desired material properties is also described.

20 Claims, 13 Drawing Sheets

(56) References Cited

U.S. PATENT DOCUMENTS

| | | | |
|---|---|---|---|
| 2006/0018098 A1 | 1/2006 | Hill et al. | |
| 2009/0244848 A1* | 10/2009 | Lim | H01L 23/4334 361/709 |
| 2010/0170795 A1* | 7/2010 | Cowburn | G01N 27/404 204/406 |
| 2011/0103021 A1* | 5/2011 | Janssen | C08K 3/04 361/714 |
| 2014/0367847 A1 | 12/2014 | Strader et al. | |
| 2016/0301819 A1 | 10/2016 | Petty et al. | |
| 2017/0004945 A1* | 1/2017 | Fuessl | H01H 85/153 |
| 2018/0042101 A1* | 2/2018 | Avalos | B29C 45/0046 |

FOREIGN PATENT DOCUMENTS

| | | |
|---|---|---|
| WO | 2015/165946 | 11/2015 |
| WO | 2016/000909 | 1/2016 |

\* cited by examiner

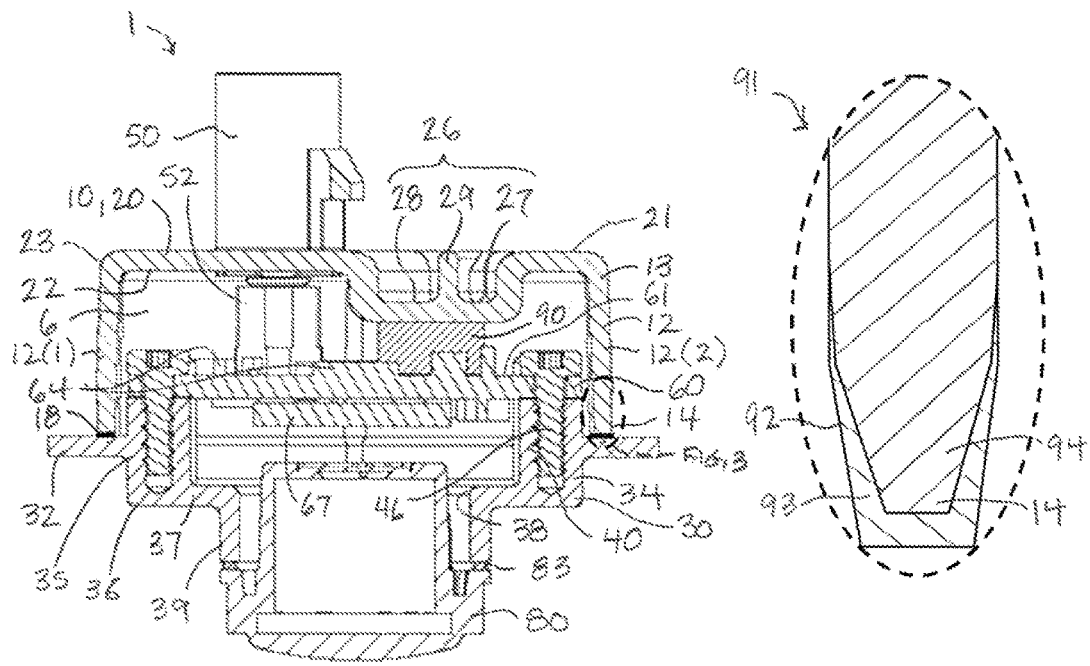
FIG. 2
FIG. 3
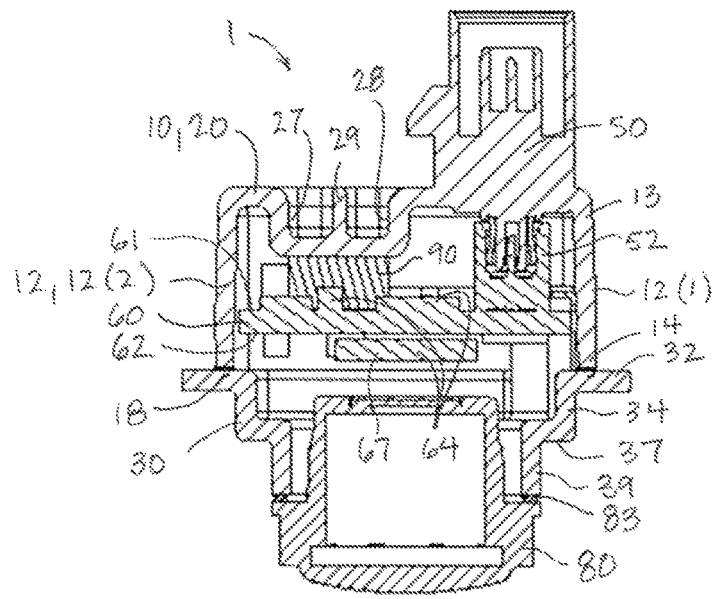
FIG. 4

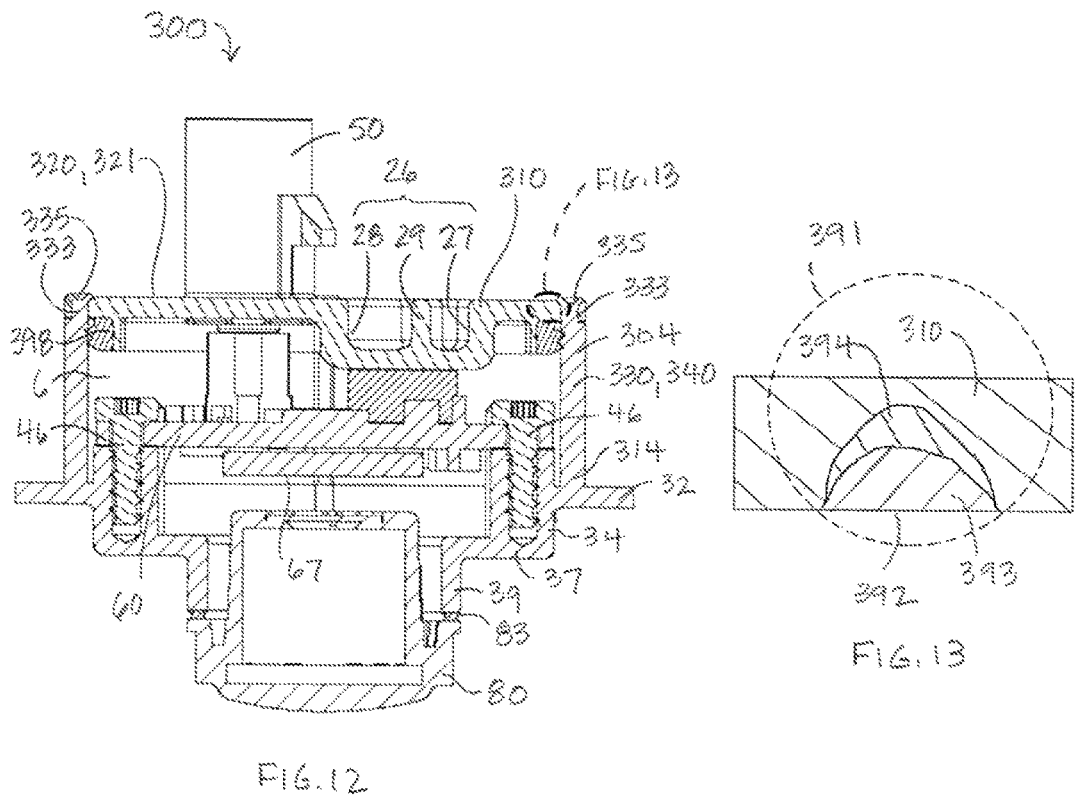
FIG. 12
FIG. 13
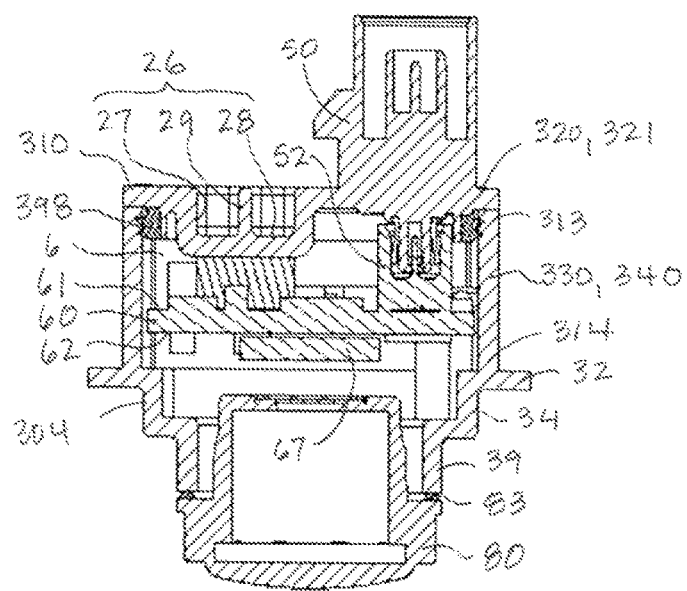
FIG. 14

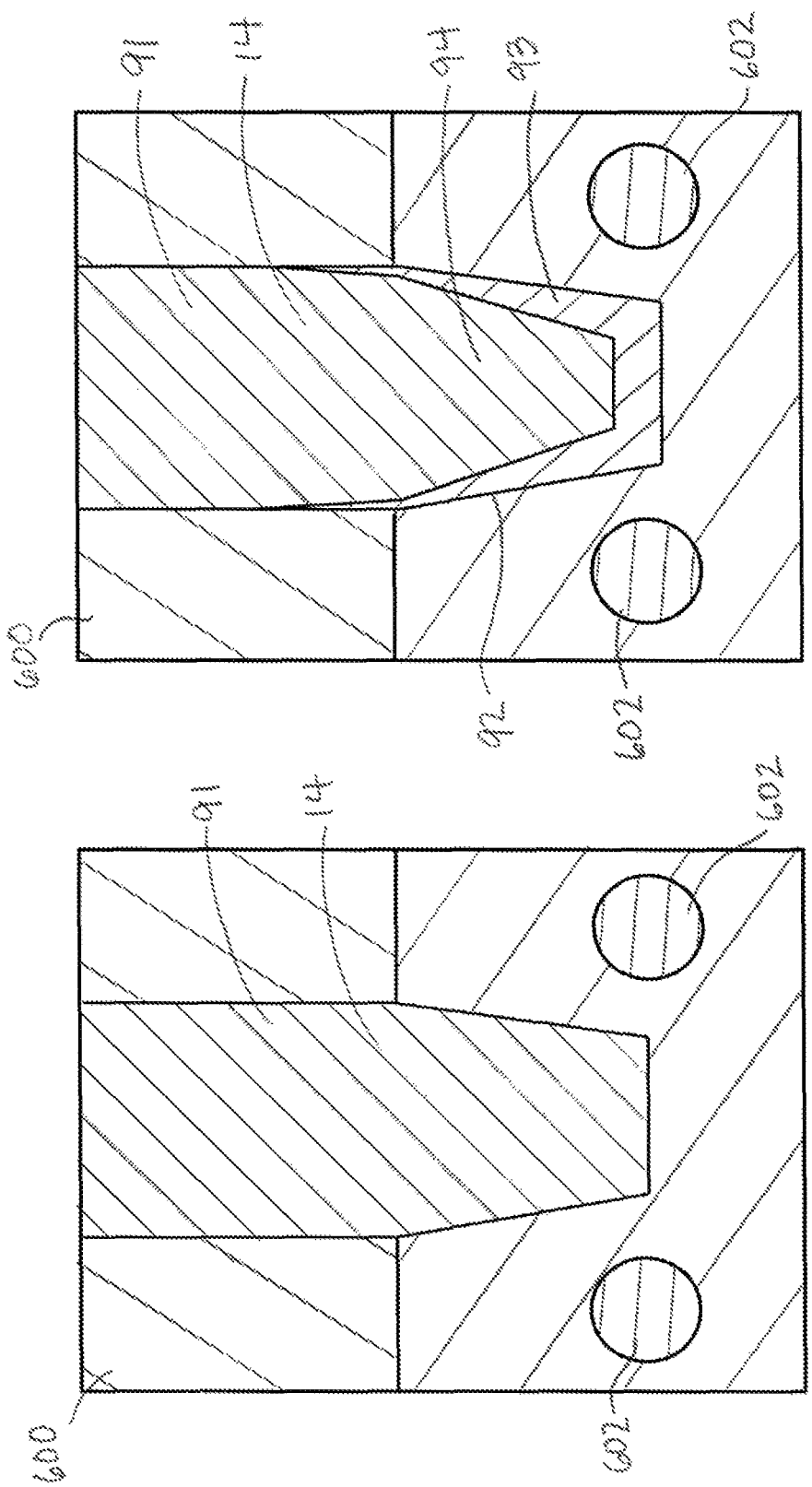

HOUSING FOR A CAMERA AND METHOD OF MANUFACTURE

BACKGROUND

Electronic devices often include electronics that are disposed in a housing that is configured to support and protect the electronics therein. For example, a vehicle camera is an electronic device that includes a camera housing that is used to support and protect camera electronics that are mounted on a printed circuit board (PCB) and camera lenses that are mounted on the camera housing. The camera housing also supports an electrical connector that is electrically connected to the PCB and permits electrical signals to pass between the PCB including the camera electronics and external circuitry. The housing may include a tray-like base, and a cover that overlies and closes the base. The PCB is supported between the base and the cover. The electronics provided on the PCB and enclosed between the cover and the base generate heat that can negatively affect performance of the camera electronics if not sufficiently dissipated. Moreover, new generation vehicle cameras such as near range cameras are required to be smaller with more functionality. The size and function requirements of the near range camera may result in sufficient heat generation by the camera electronics to cause electrical component failure unless the heat is quickly dissipated to the outside environment. For this reason, it is desirable to provide such housings at a lower cost and having improved passive cooling capabilities relative to some conventional camera housings.

SUMMARY

In some aspects, an electronic device includes a housing that in turn includes a first housing portion. The first housing portion includes a first portion of an outer surface of the housing, a first portion of housing material disposed adjoining the first portion of the outer surface, and a second portion of housing material disposed adjoining the first portion of housing material. The first portion of housing material is disposed between the second portion of housing material and the first portion of the outer surface. The first portion of the outer surface and the first portion of housing material are formed of a first thermally conductive plastic material which comprises a first plastic material and a first filler material. The amount of the first filler material within the first thermally conductive plastic material is a first percentage of the total amount of material that forms the first thermally conductive plastic material. In addition, the second portion of housing material is formed of a second thermally conductive plastic material that comprises the first plastic material and the first filler material, the amount of the first filler material within the second thermally conductive plastic material is a second percentage of the total amount of material that forms the second thermally conductive plastic material, and the second percentage is greater than the first percentage.

The electronic device may include one or more of the following features: The housing includes a sidewall that forms a closed section when viewed in cross-section and an endwall that closes a first end of the sidewall, and the first housing portion is disposed at a second end of the sidewall, where the second end is opposed to the first end. The housing includes a base that is disposed at the second end and closes the second end, the base being joined to the first housing portion via a weld joint, where the weld joint is formed of the first thermally conductive plastic material. The housing includes a sidewall that forms a closed section when viewed in cross-section and an endwall that closes a first end of the sidewall, and the first housing portion is disposed between the first end and a second end of the sidewall, where the second end is opposed to the first end. The housing includes a base, a cover and a sealed interior space that is defined between the base and the cover, the cover includes a cover sidewall that forms a closed section when viewed in cross-section and a cover endwall that closes a first end of the cover sidewall, the base is fixed to a second end of the cover sidewall, the first housing portion is disposed at the second end of the cover sidewall, where the second end is opposed to the first end, the electronic device includes a printed circuit board and a thermal interface device, the printed circuit board is disposed in the interior space, the printed circuit board including a first surface that faces the cover, a second surface that is opposed to the first surface and faces the base, and an electronic element supported on one of the first surface and the second surface, and the thermal interface device is disposed in the interior space, the thermal interface device being formed of a thermal interface material having a thermal conductivity of at least 1 W/mK, and being disposed between the first surface and the housing such that the thermal interface device contacts the printed circuit board and a portion of the cover.

The electronic device may also include one or more of the following features: The portion of the cover is formed of the second thermally conductive plastic material, which has a thermal conductivity of at least 1 W/mK. The base is formed of a laser transparent plastic material, the base is joined to the first housing portion via a weld joint, and the weld joint is formed of the first thermally conductive plastic material. The portion of the cover includes a portion of the cover endwall that is surrounded by, and spaced apart from, a peripheral edge of the cover endwall, and the peripheral edge of the cover endwall is formed of a plastic material that is different than the thermally conductive plastic material. The portion of the cover includes the cover sidewall and a portion of the cover endwall. An outward facing surface of the portion of the cover includes a passive cooling feature that comprise a pair of depressions separated by a land. The base includes a base sidewall having a first end and a second end, a flange disposed at the base sidewall first end, the flange extending outward from the base sidewall in a direction perpendicular to the base sidewall, a base endwall disposed at the base sidewall second end, the base endwall extending inward from the base sidewall in a direction that is parallel to the flange, the base endwall having an opening, and a collar that surrounds the opening and protrudes outward from the base endwall in a direction away from the flange. The electronic device further includes an electrical connector that is supported on the cover, the electrical connector including a connector housing, and electrical conductors that are supported on the connector housing and are electrically connected to the printed circuit board. The connector housing is formed of a material that is different from the thermally conductive plastic material used to form the portion of the cover. The electronic device is a camera and includes a lens assembly disposed in an opening in the base, and the electronic element is an image detector supported on the printed circuit board second surface so as to be aligned with an optical axis of the lens assembly.

In some aspects, a method of forming an assembly of a first element formed of a first material and a second element formed of a second material, in which the first element includes a target region. The method includes providing the first element, the first element having an original material structure corresponding to an original set of material properties, the original material structure extending uniformly throughout at least a volume defined by the target region of the first element. The method includes heat treating the target region of the first element such that at least a portion of the outer surface of the target region has a modified material structure corresponding to a modified set of material properties and other portions of the target region retain the material properties corresponding to the original set of material properties, the modified set of material properties being different from the original material properties. The method includes providing the second element, and positioning the first element and the second element so that the portion of the outer surface of the target region of the first element physically contacts the second element while in a predetermined configuration. The method includes forming a bond between the portion of the outer surface of the target region of the first element and the second element, whereby the second element is connected to the first element in the target region and in the predetermined configuration.

The method may include one or more of the following steps and/or features: The bond is formed by performing a laser welding process. The laser welding process includes performing laser welding including passing a laser beam through the second element to the first element. The first element includes a housing that includes a first housing portion. Prior to the heat treating step, the first housing portion includes the original set of material properties extending uniformly throughout at least the volume defined by the target region, and following the heat treating step, the target region includes a portion of an outer surface of the housing, a first portion of housing material disposed adjoining the portion of the outer surface, and a second portion of housing material disposed adjoining the first portion of housing material, the first portion of housing material disposed between the second portion of housing material and the portion of the outer surface. The portion of the outer surface and the first portion of housing material are formed of a first thermally conductive plastic material which comprises a first plastic material and a first filler material, wherein the amount of the first filler material within the first thermally conductive plastic material is a first percentage of the total amount of material that forms the first thermally conductive plastic material, and the second portion of housing material is formed of a second thermally conductive plastic material that comprises the first plastic material and the first filler material, the amount of the first filler material within the second thermally conductive plastic material is a second percentage of the total amount of material that forms the second thermally conductive plastic material, and the second percentage is greater than the first percentage. The bond is formed by a multiple shot injection molding process in which the first element is formed via a first shot of material injection and the second element is formed on the first element in the target region via a second shot of material injection. The first material and the second material are thermally conductive plastic materials having a thermal conductivity of at least 1 W mK. The first material and the second material are formed of the same constituents and differ only in the ratio of amounts of the first plastic material to the first filler material.

A vehicle camera includes a camera housing that is used to support and protect a PCB that in turn supports camera electronics including an image sensor. The camera housing supports a lens assembly so that it is aligned and appropriately spaced apart from the image sensor. In addition, the camera housing supports an electrical connector that is electrically connected to the printed circuit board and permits electrical signals to pass between the camera electronics and external circuitry.

The vehicle camera includes passive cooling features that are configured to conduct heat from the vicinity of the PCT to the camera housing. In addition, the camera housing includes passive cooling features that facilitate efficient transfer of heat from the camera housing to the environment, whereby the failure of the vehicle camera due to excessive heat is avoided. The features include forming the camera housing of two or more types of plastic materials, providing thermal conduction pathways The housing assembly disclosed herein is advantageously formed of injection-molded plastics. Thus, the housing assembly disclosed herein is much more cost effective to manufacture than some conventional electronic device housings in which the cover is formed of diecast aluminum. In addition to being more expensive to manufacture than plastic housings due to differences in material costs, metal housings also require additional structures that provide sealing and bonding functions that are not required in the plastic housing described herein.

In addition, use of plastic to form the camera housing provides cost reductions since the tooling used to form the disclosed housing has a much greater lifespan than that used to form a conventional electronic device housing. For example, a single injection molding tool may be able to provide approximately a million injection shots, whereas the tool used to diecast the aluminum cover may typically be able to provide approximately a hundred thousand castings.

Further advantages of using plastics to form the camera housing are decreased size and weight relative to the size and weight of some conventional camera housings formed of diecast aluminum. In this case, size reductions may be possible since plastic housing elements can be welded together to provide a dust and moisture seal, and thus require less space within the device that is devoted to performing sealing and securement functions as compared to some camera housing formed of diecast aluminum.

In some embodiments, selected portions of the camera housing are formed of a thermally conductive plastic (TCP). By doing so, the camera housing has some material properties similar to those of a metal enclosure and while providing the cost and design benefits of a plastic enclosure. For example, some TCP materials have polyamide 66 (PA66) or polybutylene terephthalate (PBT) as base materials, and have additives or fillers that increase the thermal conductivity from 0.25 W/m·K of traditional thermoplastics to approximately 6-10 W/m·K or more. They are available in electrically insulative and electrically conductive grades, and may be up to 50 percent lighter than aluminum, which may have a thermal conductivity of about 130 Watts/meter/Kelvin. In addition, the electrically conductive form of the TCP material may provide some level of electromagnetic compatibility (EMC) shielding for the electronics disposed within the housing.

In some embodiments, the TCP is manufactured so as to provide a housing having an optimized surface for laser welding, bonding with adhesive and/or bonding with a second material. This is achieved using a process that provides a housing surface in a target region that has a relatively higher percentage of base material relative to filler material than portions of the housing adjacent the surface. By providing a relatively higher percentage of base material at the housing surface, joining processes such as laser welding, bonding with adhesive and/or bonding with a second material at that location can be achieved more easily and reliably than with some conventionally formed TCP housings having a uniform distribution of base and filler materials.

In some embodiments, the TCP is black in color, which further improves its radiation properties when compared to some conventional electronic device housings in which the cover is formed of diecast aluminum and thus has a silver color.

BRIEF DESCRIPTION OF THE DRAWINGS

FIG. 2 is a cross sectional view of the vehicle camera of FIG. 1 as seen along line 2-2 of FIG. 1.

FIG. 3 is an enlarged view of the portion of FIG. 2 indicated by broken lines.

FIG. 4 is a cross sectional view of the vehicle camera of FIG. 1 as seen along line 4-4 of FIG. 1.

FIG. 12 is a cross sectional view of the vehicle camera of FIG. 11 as seen along line 12-12 of FIG. 11.

FIG. 13 is an enlarged view of the portion of FIG. 12 indicated by broken lines.

FIG. 14 is a cross sectional view of the vehicle camera of FIG. 11 as seen along line 14-14 of FIG. 11.

FIG. 19 is a cross sectional view of a portion of an injection molding tool used to form the housing cover, illustrating the target portion of the cover before heat treatment.

FIG. 20 is a cross sectional view of a portion of an injection molding tool used to form the housing cover, illustrating the target portion of the cover after heat treatment.

DETAILED DESCRIPTION

Figure 1:
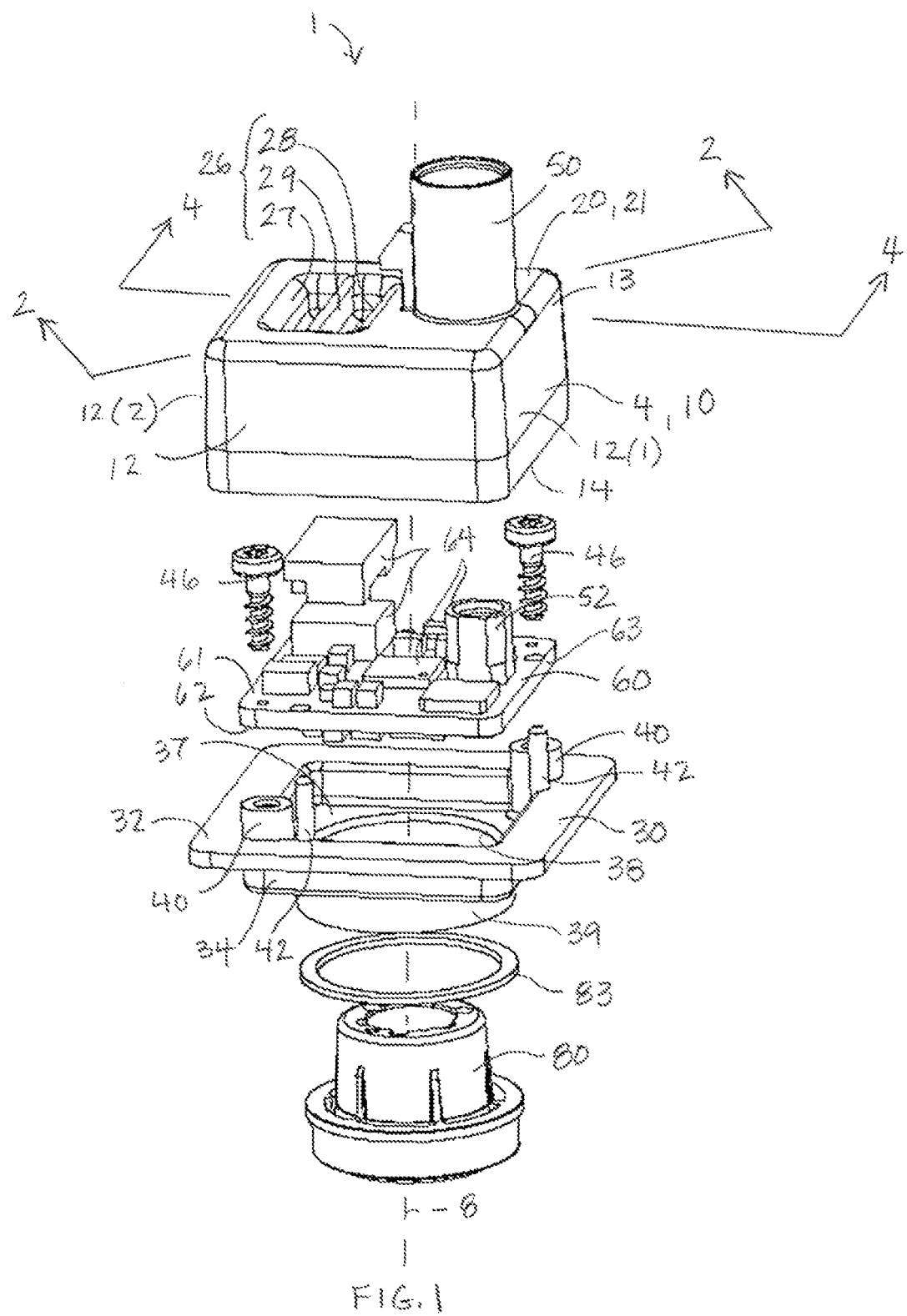
FIG. 1 is an exploded perspective view of a vehicle camera.

Referring to FIGS. 1, 2 and 4, an electronic device, such as a vehicle camera 1, includes electronic components 64 that are disposed in a camera housing 4 that is configured to support and protect the electronic components 64 therein. The electronic components 64, including an image detector 67, are mounted on a PCB 60. The vehicle camera 1 also includes a camera lens assembly 80 that is mounted on the camera housing 4. The camera housing 4 also supports an electrical connector 50 that is electrically connected to the PCB 60 and permits electrical signals to pass between the electronic components 64 of the PCB 60 and external circuitry (not shown). The camera housing 4 may include a tray-like base 30 and a cover 10 that overlies and closes the base 30, and the PCB 60 is supported between the base 30 and the cover 10. The camera housing 4 protects the PCB 60 and the associated electronic components 64 from moisture and debris, and includes passive cooling features that permit reliable operation of the vehicle camera 1, as discussed in detail below.

The base 30 of the camera housing 4 is a shallow container that includes a base sidewall 34 having a first end 35 and a second end 36 that is opposed to the first end 35. The base sidewall 34 forms a closed section having a rectangular shape when viewed along a housing centerline 8 that is parallel to the base sidewall 34. A flange 32 is disposed at the base sidewall first end 35. The flange 32 protrudes outwardly from the base sidewall 34 in a direction perpendicular to the base sidewall 34 and surrounds a periphery of the base sidewall 34.

The base 30 includes a base endwall 37 disposed at the base sidewall second end 36. The base endwall 37 closes the base sidewall second end 36, and is offset from, and parallel to, the flange 32. Bosses 40 are disposed in a pair of diagonally opposed corners of the base 30 and protrude from the base endwall 37 toward the cover 10. The bosses 40 include blind openings that are configured to receive screws 46 used to secure the PCB 60 to the base endwall 37. The bosses 40 also serve as stand-offs that support the PCB 60 in a spaced relationship relative to the base endwall 37. The base 30 may also include alignment pins 42 that protrude from the base endwall 37 toward the cover 10, and are received in corresponding openings formed in the PCB 60. The alignment pins 42 serve to position the PCB 60 relative to the base 30 and lens assembly 80 prior to insertion of the screws 46 into the bosses 40.

The base endwall 37 includes an opening 38 through which the lens assembly 80 extends. A cylindrical collar 39 surrounds the opening 38 and protrudes outward from an outer surface of the base endwall 37. The collar 39 supports the lens assembly 80 and facilitates alignment of the lens assembly 80 with the image detector 67. A seal 83, for example a bead of adhesive, is disposed between the collar 39 and the lens assembly 80 to retain the lens assembly 80 within the collar 39 and to prevent moisture from entering the camera housing 4.

The cover 10 is a cup-like container that when assembled with the base 30 cooperates with the base 30 to define a housing interior space 6. The cover 10 includes a cover sidewall 12 having a first end 13 and a second end 14 that is opposed to the first end 13. The cover sidewall 12 is long relative to a length of the base sidewall 34. For example, in the illustrated embodiment, the distance between the cover sidewall first and second ends 13, 14 is at least twice the distance between the base sidewall first and second ends 35, 36. The cover sidewall 12 forms a closed section having a shape when viewed along the housing centerline 8 that corresponds to the shape of the base sidewall 34. In the illustrated embodiment, the cover sidewall 12 is rectangular in shape.

The cover 10 includes a cover end wall 20 disposed at the cover sidewall first end 13. A peripheral edge 23 of the cover endwall 20 is joined to the cover sidewall first end 13, and the cover endwall 20 closes the cover sidewall first end 13. The electrical connector 50 is supported on the cover endwall 20 adjacent to a first portion 12(1) of the cover sidewall 12. In addition, a passive cooling feature 26 is formed in the cover end wall 20 at a location between the electrical connector 50 and a second portion 12(2) of the cover sidewall 12. The second portion 12(2) is on an opposed side of the cover endwall 20 relative to the first portion 12(1). The passive cooling feature 26 includes a pair of depressions 27, 28 separated by a land 29. In effect, the passive cooling feature 26 provides a region of relatively high surface area along the cover end wall 20, facilitating efficient thermal convection from the cover end wall 20 to the atmosphere.

The PCB 60 is disposed in the interior space 6 between the base 30 and the cover 10 in such a way that the PCB 60 is fixed within the camera housing 4. In the illustrated embodiment, the PCB 60 is fixed to the base 30 and is used to support and provide electrical connections between the electrical connector 50 and the external circuitry which may include an electronic control unit (not shown).

The PCB 60 is a rigid, multi-layer sheet of insulative material that includes electrically conductive tracks (not shown) used to electrically connect electronic components 64 to each other and/or to the electrical connector 50. The electrical connector 50 is electrical connected to the PCB 60 via a plug 52 disposed on a first, cover-facing surface 61 of the PCB 60. The electrical connector 50 may, for example, be of the type used to engage a wiring harness connector (not shown). The PCB 60 supports the electronic components 64, a controller, electrolytic capacitors, power components, etcetera, on both the first surface 61, and on the opposed, second surface 62 that faces the base 30. In the vehicle camera 1, the image detector 67 is disposed on the PCB second surface 62 at a location that is in alignment with the lens assembly 80. In addition, the PCB 60 may include thermally conductive vias (not shown) that extend between the first and second sides 61, 62. In some embodiments, the vias are dedicated to thermal conduction, while in other embodiments, the vias function as both electrical and thermal conduction pathways.

The vehicle camera 1 includes a thermal interface device 90 that is disposed between the PCB first surface 61 and the camera housing 4 such that the thermal interface device 90 physically contacts both the PCB 60 and a portion of the cover 10. In particular, the thermal interface device 90 physically contacts the PCB 60 and the portion of the cover 10 that includes the passive cooling feature 26. The relatively large surface area provided by the inner surface of the cover end wall 20 in the portion including the passive cooling feature 26 facilitates good thermal conduction between the thermal interface device 90 and the cover 10. In addition, the relatively large surface area provided by the outer surface of the cover end wall 20 in the portion including the passive cooling feature 26 facilitates good thermal convection between the cover 10 and the atmosphere.

The thermal interface device 90 is a thermal interface material (TIM). The term TIM is used herein to refer to a thermally conductive material that is relatively soft and compliant prior to curing, and becomes substantially rigid after curing. Alternatively the TIM may be in the form of a grease, a paste, a gel, a tape, a pad, etc. as appropriate. In the illustrated embodiment, the TIM has a thermal conductivity of at least 1 W/mK.

Since the TIM is disposed between the PCB first surface 61 and the cover 10, cooling of the PCB 60 and its associated electronics is achieved via thermal conduction between the PCB 60 and the cover 10 via the TIM. In addition, conductive cooling of the electronic components 64 including the image detector 67 that are supported on the second surface 62 of the PCB 60 may be facilitated by way of the thermally conductive vias that extend between the first surface 61 and the second surface 62 of the PCB 60.

The cover 10 is formed of a TCP material. As used herein, the term TCP refers to a plastic material having a higher thermal conductivity than some conventional plastic materials. In the illustrated embodiment, the TCP has a thermal conductivity of at least 1 W/mK. In other embodiments, the TCP has a thermal conductivity of at least 2 W/mK. In still other embodiments, the TCP has a thermal conductivity of at least 5 W/mK. In some embodiments, the TCP may include a conventional plastic base material such as PA66 or PBT that includes filler material that increases the thermal conductivity of the plastic base material. For example, the filler material may be graphite, glass or ceramic particles. In some embodiments, the TCP may be electrically conductive. In embodiments in which the TCP is electrically conductive, the cover 10 may provide EMC shielding of the PCB 60 and the electronic components 67.

Use of the TCP material to form portions of the camera housing 4 is advantageous since a metal enclosure can be avoided while known cost and design benefits of a plastic enclosure are provided.

Referring to FIGS. 2 and 3, the cover 10 may include features that facilitate bonding of the cover 10 with a second element (e.g., the base) for example via a laser welding process. The features include providing a housing surface that is optimized for bonding by having a relatively higher percentage of base material relative to filler material than portions of the housing adjacent the surface. This is achieved, for example, using a manufacturing process described in detail below. The optimized housing surface includes a housing portion (e.g., a target portion) 91 corresponding to a location at which it is desired to form a weld joint with the base 30. Thus, in the illustrated embodiment, the housing portion 91 corresponds to the cover sidewall second end 14, which is laser welded to the base flange 32. The housing portion 91 includes a surface portion 92 corresponding to an outer surface of the cover sidewall second end 14, a first portion of housing material 93 disposed adjoining the surface portion 92, and a second portion of housing material 94 disposed adjoining the first portion of housing material 93. The first portion of housing material 93 is disposed between the second portion of housing material 94 and the surface portion 92.

The surface portion 92 and the first portion of housing material 93 are formed of a first thermally conductive plastic material which comprises a first base material and a first filler material. For example, in the illustrated embodiment, the first base material is a conventional plastic such as PA66 and the first filler material is a thermally conductive material such as graphite, but other appropriate materials can be substituted. The amount of the first filler material (e.g., graphite) within the first thermally conductive plastic material is a first percentage of the total amount of material that forms the first thermally conductive plastic material. In addition, the second portion of housing material 94 is formed of a second thermally conductive plastic material that comprises the first base material (e.g., PA66) and the first filler material (e.g., graphite). The amount of the first filler material (e.g., graphite) within the second thermally conductive plastic material is a second percentage of the total amount of material that forms the second thermally conductive plastic material, and the second percentage is greater than the first percentage. That is, the first thermally conductive plastic material and the second thermally conductive plastic material have substantially the same components, but have different proportions of base material and filler material.

As a result, the surface portion 92 and the first portion of housing material 93 have more base material than does the second portion of housing material 94, which is disposed at a location spaced apart from the surface portion 92. Since the surface portion 92 and the first portion of housing material 93 have a relatively high proportion of base material, forming a reliable weld joint with the base 30 becomes easy and reliable.

The base 30 is formed separately from the cover 10 and is formed of a different plastic material. In some embodiments, the base 30 is formed of a laser transparent plastic (LTP) material. Use of a LTP material to form the base 30 is advantageous since it allows use of a laser welding process to join the cover 10 to the base 30, as discussed in detail below. An additional advantage in forming the base 30 of a different plastic material includes an overall reduction in material costs, since TCP materials are relatively higher in cost of as compared to some conventional plastic materials. In further addition, some TCP materials may be relatively brittle as compared to some other plastic materials. By forming the base 30 of a non-TCP material, the base 30 may have a higher strength than the portions of the camera housing 4 formed of TCP material, whereby the structural integrity of the camera housing 4 is improved relative to a camera housing formed entirely of TCP materials.

The camera housing 4 securely supports the PCB 60 and its associated electronic components 64 while providing improved cooling properties and lower manufacturing costs. This is achieved by forming the cover 10 of a TCP material, providing the thermal interface device 90 formed of a TIM between the PCB 60 and the cover 10, and by providing the passive cooling features 26 formed of a TCP on an outer surface of the cover 10. By strategic selection and placement of the materials used to form the camera housing 4, cooling of the vehicle camera 1 can be improved relative to some conventional plastic housings.

As a result, the advantages of using a light weight material such as plastic can be realized while providing a camera housing 4 configured to safely and securely house the PCB 60 including the image sensor 67. By forming the cover 10 as an assembly that includes a TCP plastic cover 10 having passive cooling features and a base 30 having relatively high strength and a plastic heat sink portion 60 having optimized thermal conduction properties, a light weight, low cost housing assembly is provided.

Figure 5:
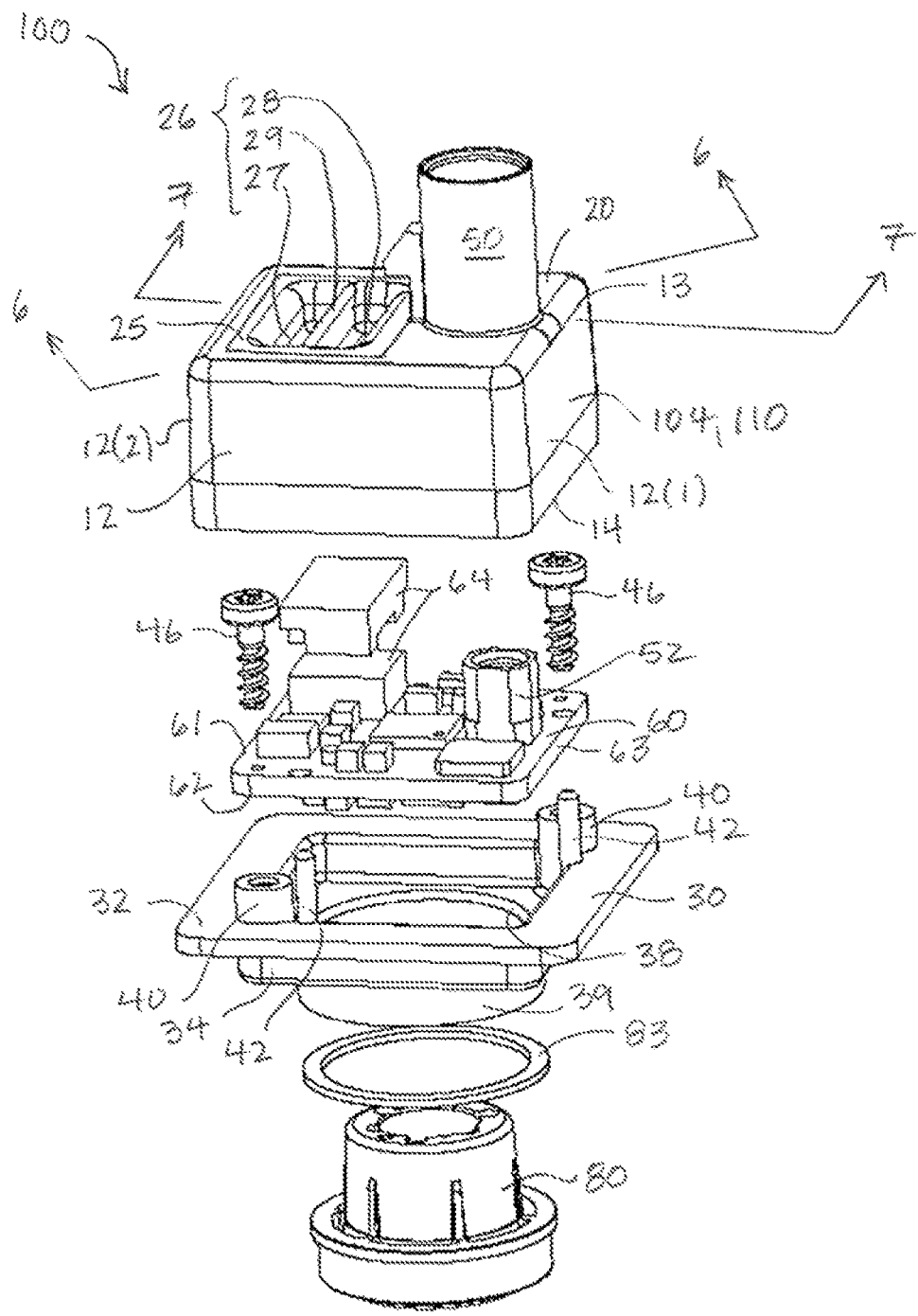
FIG. 5 is an exploded perspective view of an alternative embodiment vehicle camera.
Figure 6:
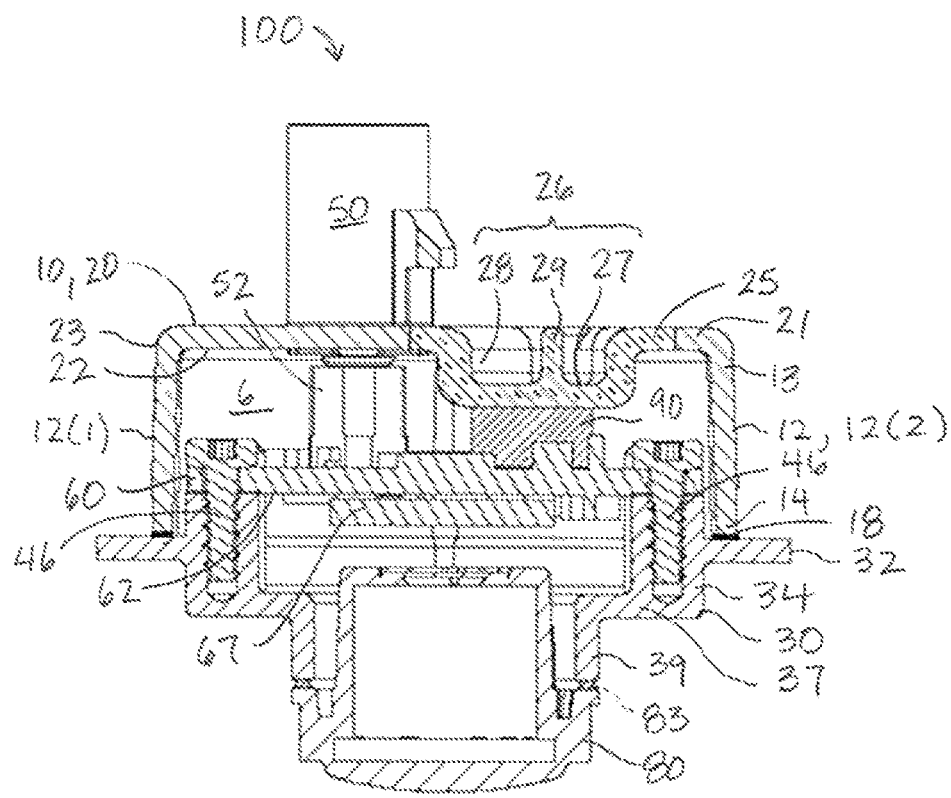
FIG. 6 is a cross sectional view of the vehicle camera of FIG. 5 as seen along line 6-6 of FIG. 5.
Figure 7:
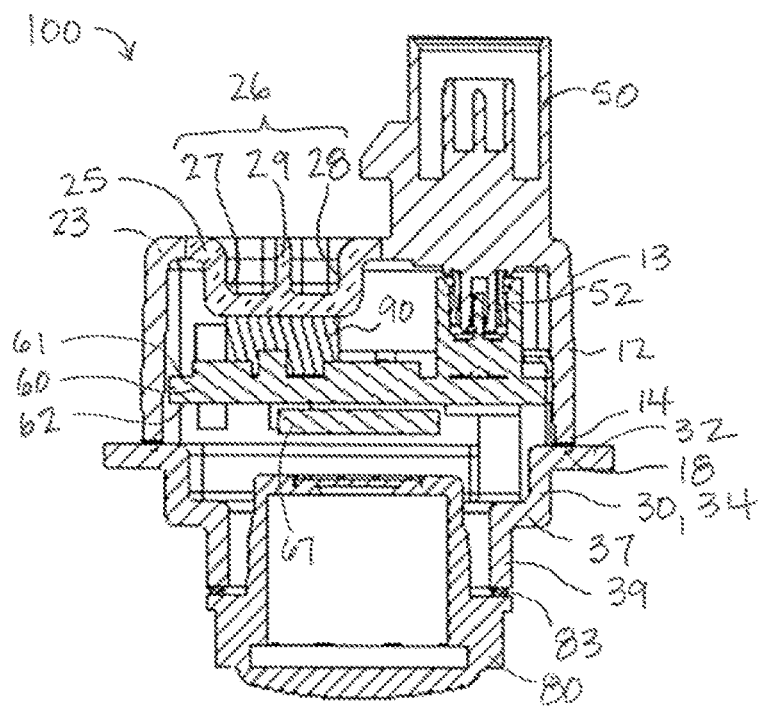
FIG. 7 is a cross sectional view of the vehicle camera of FIG. 5 as seen along line 7-7 of FIG. 5.

Referring to FIGS. 5-7, an alternative embodiment vehicle camera 100 is similar to the vehicle camera 1 described above with respect to FIGS. 1-4, and common reference numbers are used to refer to common elements. The vehicle camera 100 illustrated in FIGS. 5-7 differs from the vehicle camera 1 described above with respect to FIGS. 1-4 in that it includes an alternative embodiment camera housing 104. The camera housing 104 includes the base 30 and a cover 110 that overlies and closes the base 30. Like the earlier-described embodiment, the PCB 60 is supported between the base 30 and the cover 110. In addition, the camera housing 104 protects the PCB 60 and the associated electronic components 64 from moisture and debris, and includes passive cooling features that permit reliable operation of the vehicle camera 100.

The cover 110 illustrated in FIGS. 5-7 differs from the cover 10 illustrated in FIGS. 1-4 in that only a portion of the cover 110 is formed of a TCP material. In particular, a portion 25 of the cover endwall 20 is formed of TCP. The remainder of the cover 10, including the connector 50, the peripheral edge 23 of the cover endwall 20 and the cover sidewall 12, is formed of a plastic material that is different than the thermally conductive plastic material. For example, in some embodiments, the connector 50, the peripheral edge 23 of the cover endwall 20 and the cover sidewall 12 may be formed of a conventional plastic such as carbon black plastic (CBP).

The portion 25 of the cover endwall 20 that is formed of a TCP material is surrounded by, and spaced apart from, a peripheral edge 23 of the cover endwall 20. The portion 25 of the cover endwall 20 is strategically placed to facilitate cooling of the vehicle camera 1. In particular, The portion 25 of the cover endwall 20 includes the passive cooling feature 26 and portions of the cover endwall 20 immediately adjacent to the passive cooling feature 26. As a result, the portion 25 of the cover endwall 20 contacts the thermal interface device 90, and the camera housing 104 provides passive conducive and convective cooling benefits, while minimizing material costs associated with use of TCP.

Figure 8:
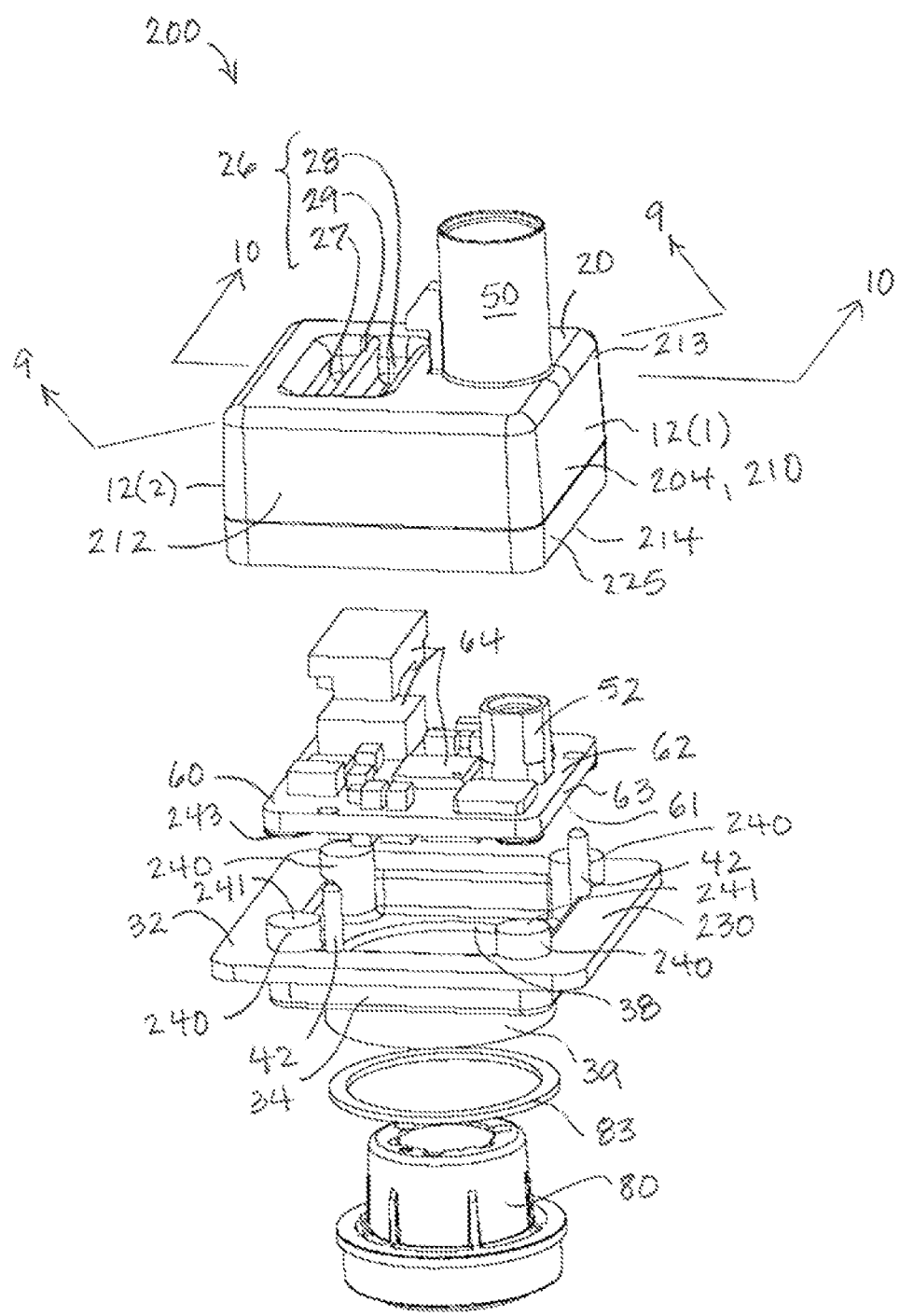
FIG. 8 is an exploded perspective view of another alternative embodiment vehicle camera.
Figure 9:
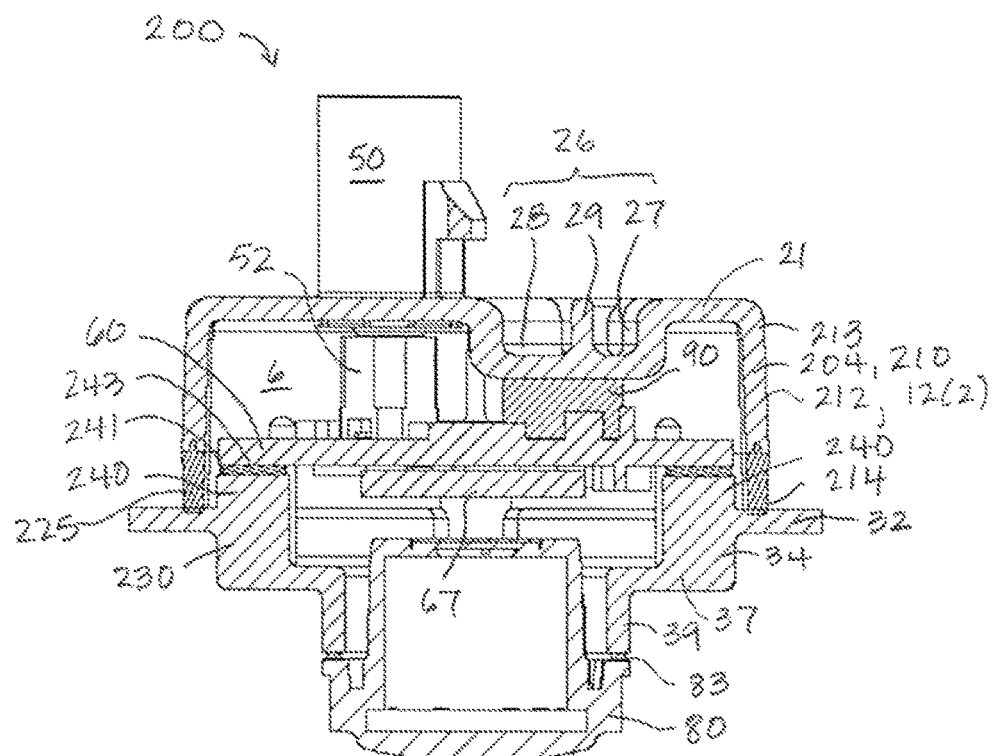
FIG. 9 is a cross sectional view of the vehicle camera of FIG. 8 as seen along line 9-9 of FIG. 8.
Figure 10:
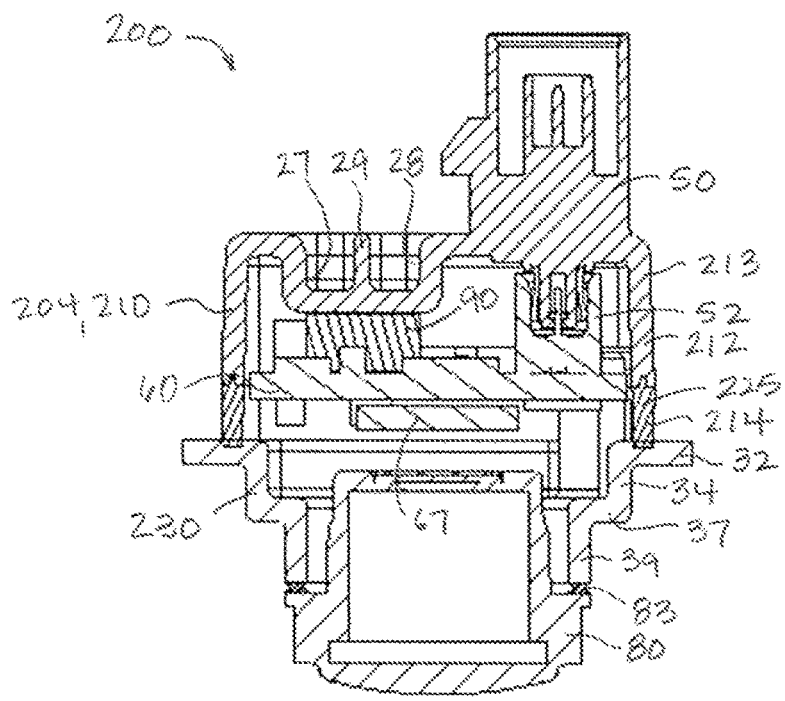
FIG. 10 is a cross sectional view of the vehicle camera of FIG. 8 as seen along line 10-10 of FIG. 8.
Figure 11:
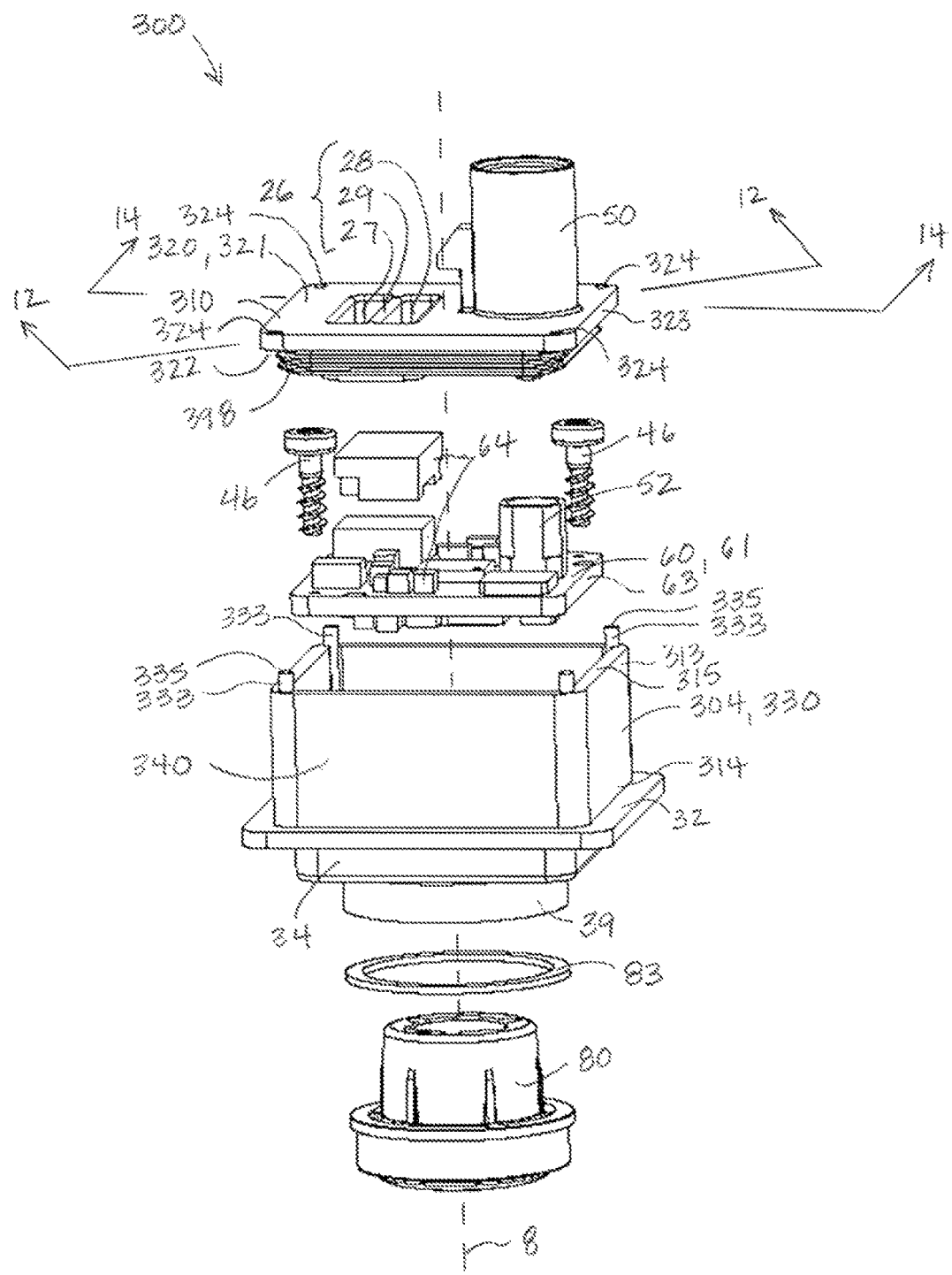
FIG. 11 is an exploded perspective view of another alternative embodiment vehicle camera.

Referring to FIGS. 8-10, another alternative embodiment vehicle camera 200 is similar to the vehicle camera 1 described above with respect to FIGS. 1-4, and common reference numbers are used to refer to common elements. The vehicle camera 200 illustrated in FIGS. 8-10 differs from the vehicle camera 1 described above with respect to FIGS. 1-4 in that it includes an alternative embodiment camera housing 204. The camera housing 204 includes a base 230 and a cover 210 that overlies and closes the base 230. Like the earlier-described embodiment, the PCB 60 is supported between the base 230 and the cover 210. In addition, the camera housing 204 protects the PCB 60 and the associated electronic components 64 from moisture and debris, and includes passive cooling features that permit reliable operation of the vehicle camera 200.

The cover 210 illustrated in FIGS. 8-10 differs from the cover 10 illustrated in FIGS. 1-4 in that the cover 210 is formed of two different plastic materials. In particular, a portion 225 of the cover sidewall 212 is formed of a conventional plastic material such as CBP. More particularly, the cover sidewall second end 214 is formed of CBP. The remainder of the cover 210 including the cover sidewall first end 213, the cover endwall 220 including the connector and the passive cooling feature 26, are formed of TCP.

The portion 225 of the cover sidewall 212 that is formed of a CBP material is provides the terminal or free end of the cover sidewall 212 that is joined to the base by laser welding. By forming the portion 225 of the cover sidewall of CBP, a secure weld joint is easily and reliably formed between the cover 210 and the base 230. In some embodiments, the portion 225 of the cover sidewall 212 is formed on the remainder of the cover 210 in a second shot injection molding process.

Since a portion of the cover sidewall 212 and the cover endwall 220 including the passive cooling feature 26 are formed of TCP, the camera housing 204 provides passive conducive and convective cooling benefits, while minimizing material costs associated with use of TCP.

The vehicle camera 200 illustrated in FIGS. 8-10 further differs from the vehicle camera 1 described above with respect to FIGS. 1-4 in that it includes an alternative mechanism for fastening the PCB 60 to the base 230. The base 230 is similar to the base 30 described above with respect to FIGS. 1-4 except that the bosses 40 of FIGS. 1-4 are replaced by standoffs 240. A standoff 240 is disposed in each corner of the base 30 and protrudes from the base endwall 37 toward the cover 210. The standoffs 240 are cylindrical, and each has a planer terminal end surface 241. The standoffs 240 support the PCB 60 in a spaced relationship relative to the base endwall 37. In the illustrated embodiment, the second side 62 of the PCB 60 is secured to the standoff terminal end surface 241 using adhesive 243.

Referring to FIGS. 11-14, another alternative embodiment vehicle camera 300 is similar to the vehicle camera 1 described above with respect to FIGS. 1-4, and common reference numbers are used to refer to common elements. The vehicle camera 300 illustrated in FIGS. 11-14 differs from the vehicle camera 1 described above with respect to FIGS. 1-4 in that it includes an alternative embodiment camera housing 304. The camera housing 304 includes a base 330 and a cover 310 that overlies and closes the base 330. Like the earlier-described embodiment, the PCB 60 is supported between the base 330 and the cover 310. In addition, the camera housing 304 protects the PCB 60 and the associated electronic components 64 from moisture and debris, and includes passive cooling features that permit reliable operation of the vehicle camera 300.

The cover 310 illustrated in FIGS. 11-14 differs from the cover 10 illustrated in FIGS. 1-4 in that the cover 310 is sidewall-free. In particular, the cover 310 is a generally plate-like element that, when assembled with the base 330, cooperates with the base 330 to define the housing interior space 6. The cover 310 includes an outward-facing surface 321, and an opposed, PCB-facing surface 322. A peripheral edge 323 of the cover 310 has a rectangular profile when viewed along the housing centerline 8. In addition, openings 324 are provided in each corner of the cover 310. The openings 324 receive posts 333 that are provided on the base 330 and used to secure the cover 310 to the base 330 as discussed in detail below.

Similar to the cover 30 illustrated in FIGS. 11-14, the cover 310 includes the connector 50 and the passive cooling features 26 as described above. In addition, the cover 310 is formed of TCP.

The base 330 illustrated in FIGS. 11-14 differs from the base 30 illustrated in FIGS. 1-4 in that the base 30 includes a secondary sidewall 340 that protrudes from a cover-facing surface of the flange 32. The secondary sidewall 340 includes a first end 313 and a second end 314. The secondary wall second end 314 is opposed to the first end 313. The secondary sidewall 340 is long relative to the length of the base sidewall 34. For example, in the illustrated embodiment, the distance between the secondary sidewall first and second ends 313, 314 is at least twice the distance between the base sidewall first and second ends 35, 36. The secondary sidewall 340 forms a closed section having a shape when viewed along the housing centerline 8 that corresponds to the shape of the base sidewall 34. In the illustrated embodiment, the secondary sidewall 340 is rectangular in shape.

The secondary wall second end 314 is joined to, or integral with, the flange 32. The secondary wall first end 313 includes a free edge 315. The posts 333 protrude from the free edge 315 in a direction parallel to the housing centerline 8. In the illustrated embodiment, the secondary sidewall 340 includes four posts 333, and a post 333 is disposed in each corner of the secondary sidewall 340. The posts 333 are shaped and dimensioned to be received within the cover openings 324 in a press-fit manner, and terminal ends 335 of the posts 333 are generally flush with the cover outward-facing surface 321. In some embodiments, following assembly of the cover 310 with the secondary sidewall first end 313, each of the terminals ends 335 of the posts 333 are deformed via for example a punching process. The deformed terminal ends 335 engage the cover 310, thereby retaining the cover 310 on the secondary sidewall first end 313.

In some embodiments, the base 330, including the secondary sidewall 340, the flange 32, the base sidewall 34, the base endwall 37 and the collar 39, are formed of TCP.

The camera housing 304 includes an annular seal 398 that is disposed on the cover inward facing surface 322 at a location that is slightly inboard relative to the cover peripheral edge 323. The seal 398 abuts the secondary sidewall first end 313. The seal 398 prevents moisture and debris from entering the camera housing 304 along the interface between the cover 310 and the base 330.

Referring to FIGS. 12 and 13, in some embodiments, the cover 310 may include features that facilitate bonding of the seal 398 with the cover inward facing surface 322. The features include providing a housing surface that is optimized for bonding by having a relatively higher percentage of base material relative to filler material than portions of the housing adjacent the surface. This is achieved, for example, using the manufacturing process described in detail below. The optimized housing surface includes a housing portion 391 corresponding to a location at which it is desired to form an adhesive joint with the base 330. Thus, in the illustrated embodiment, the housing portion 391 corresponds to cover inward facing surface 322, which is joined to the seal 398 during manufacturing. The housing portion 391 includes a surface portion 392 corresponding to the cover inward facing surface 322 for example at a location adjacent the cover peripheral edge 323, a first portion of housing material 393 disposed adjoining the surface portion 392, and a second portion of housing material 394 disposed adjoining the first portion of housing material 393. The first portion of housing material 393 is disposed between the second portion of housing material 394 and the surface portion 392.

The surface portion 392 and the first portion of housing material 393 are formed of a first thermally conductive plastic material which includes a first base material and a first filler material. For example, in the illustrated embodiment, the first base material is a conventional plastic such as PA66 and the first filler material is a thermally conductive material such as graphite, but other appropriate materials can be substituted. The amount of the first filler material (e.g., graphite) within the first thermally conductive plastic material is a first percentage of the total amount of material that forms the first thermally conductive plastic material. In addition, the second portion of housing material 394 is formed of a second thermally conductive plastic material that comprises the first base material (e.g., PA66) and the first filler material (e.g., graphite). The amount of the first filler material (e.g., graphite) within the second thermally conductive plastic material is a second percentage of the total amount of material that forms the second thermally conductive plastic material, and the second percentage is greater than the first percentage. That is, the first thermally conductive plastic material and the second thermally conductive plastic material have substantially the same components, but have different proportions of base material and filler material.

As a result, the surface portion 392 and the first portion of housing material 393 have more base material than does the second portion of housing material 394, which is disposed at a location spaced apart from the surface portion 392. In some embodiments, the seal 398 is formed as a second shot of an injection molding process, in which the base 330 is formed as the first shot. Since the surface portion 392 and the first portion of housing material 393 have a relatively high proportion of base material, forming a reliable bond between the seal 398 and the surface portion 392 becomes easy and reliable.

In other embodiments, the base 330, including the secondary sidewall 340, the flange 32, the base sidewall 34, the base endwall 37 and the collar 39, are formed of metal such as aluminum. When the base 330 is formed of a metal, the seal 398 may be secured to the inner surface using adhesive or by other appropriate methods.

Figure 15:
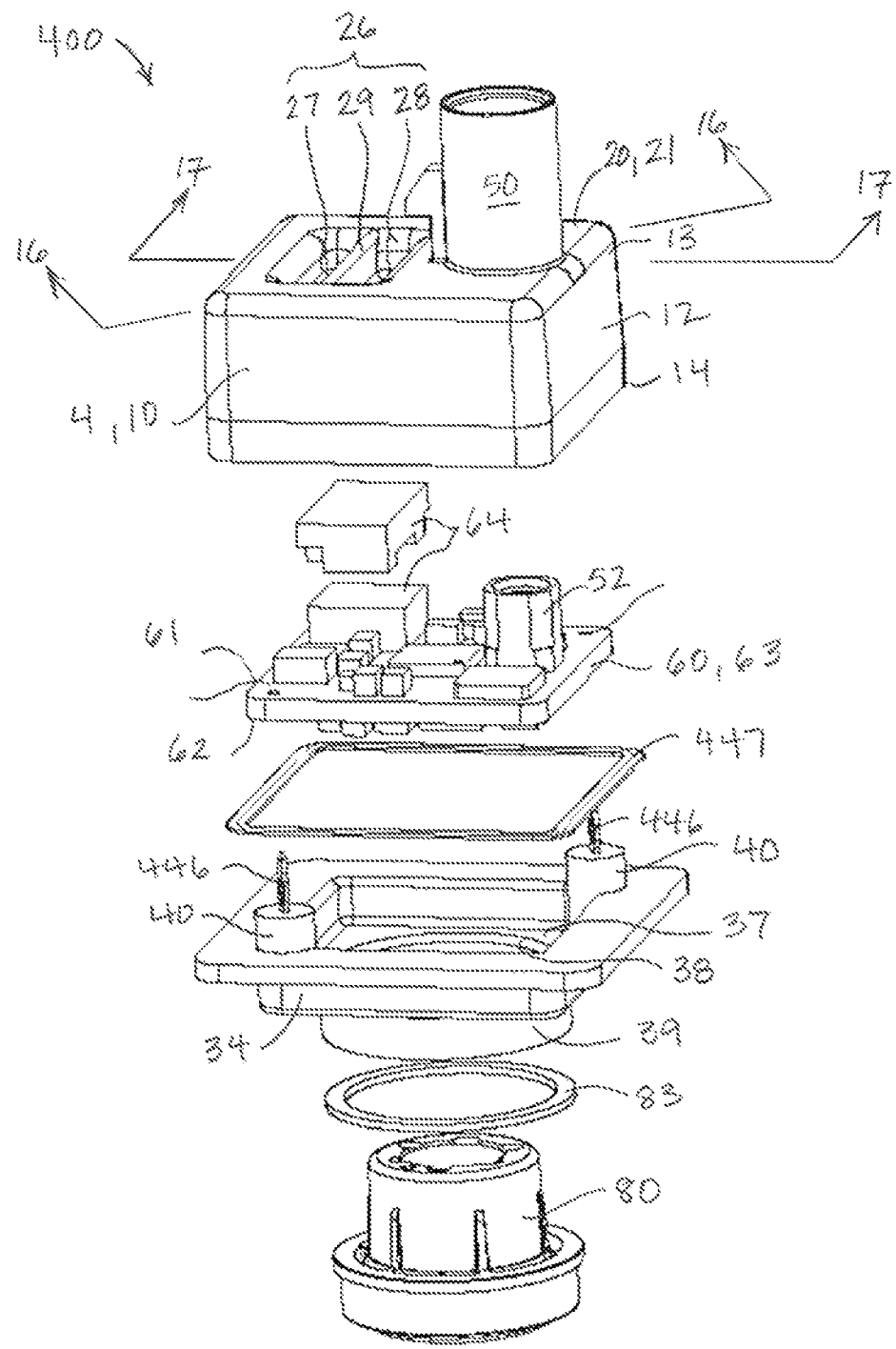
FIG. 15 is an exploded perspective view of another alternative embodiment vehicle camera.
Figure 16:
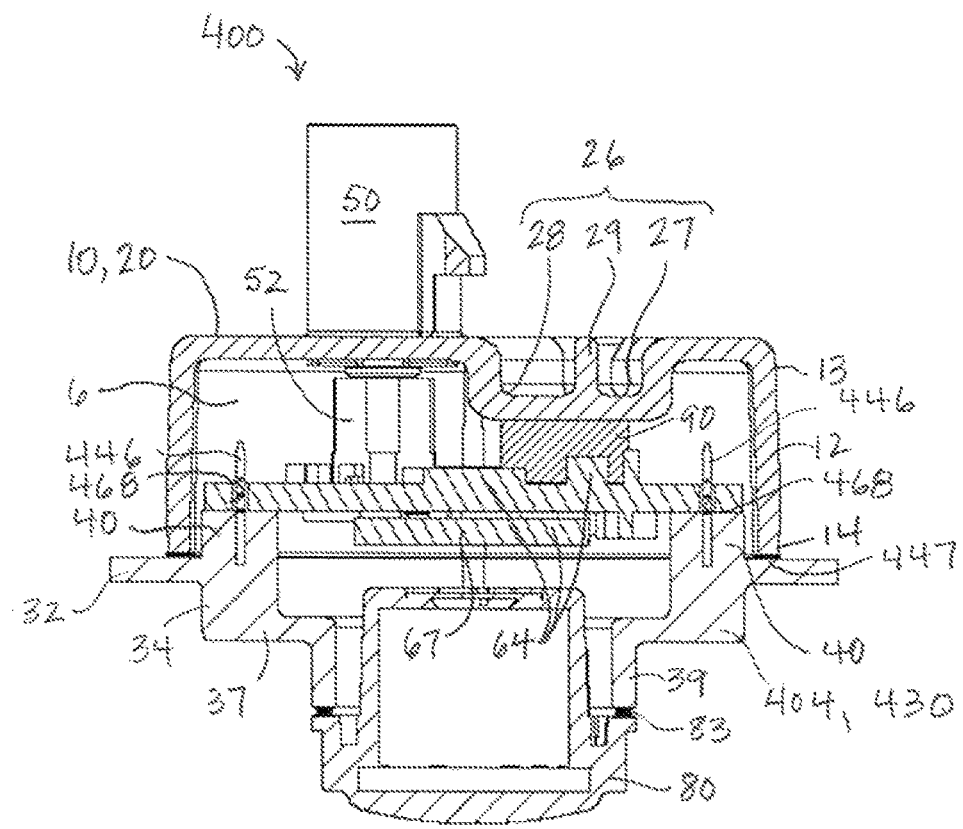
FIG. 16 is a cross sectional view of the vehicle camera of FIG. 15 as seen along line 16-16 of FIG. 15.
Figure 17:
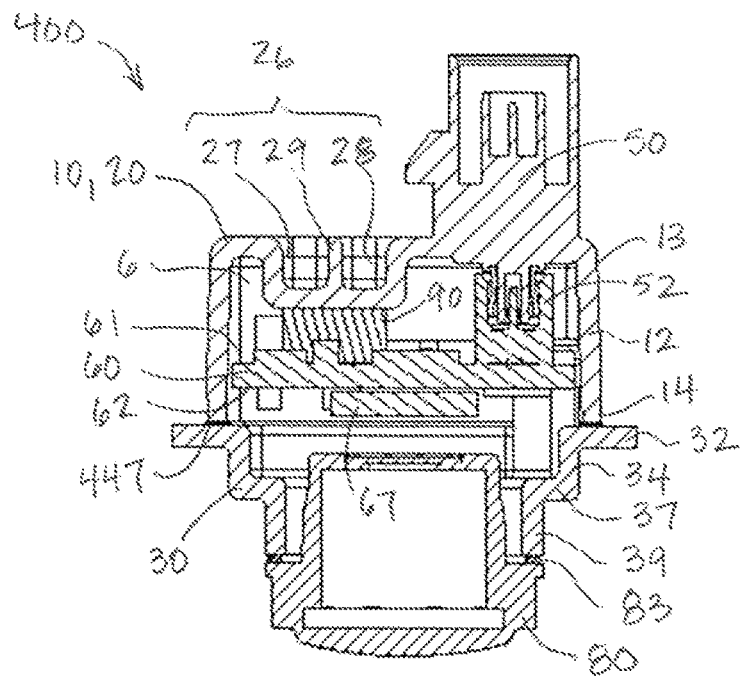
FIG. 17 is a cross sectional view of the vehicle camera of FIG. 15 as seen along line 17-17 of FIG. 15.
Figure 18:
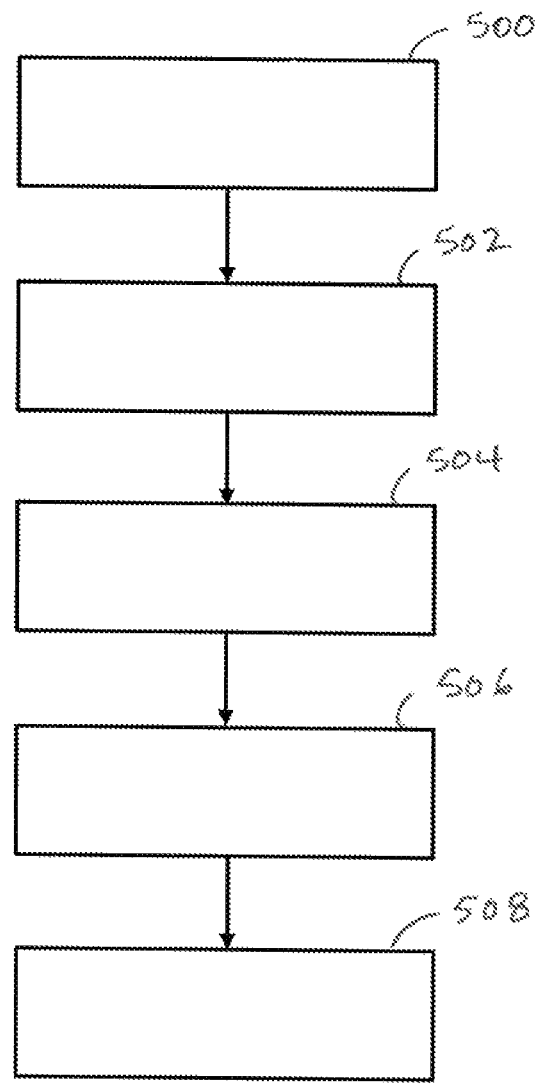
FIG. 18 is a flow chart illustrating a method of manufacturing.

Referring to FIGS. 15-17, another alternative embodiment vehicle camera 400 is similar to the vehicle camera 1 described above with respect to FIGS. 1-4, and common reference numbers are used to refer to common elements. The vehicle camera 400 illustrated in FIGS. 15-17 differs from the vehicle camera 1 described above with respect to FIGS. 1-4 in that it includes an alternative embodiment camera housing 404. The camera housing 404 includes an alternative base 430 and the cover 10 that overlies and closes the base 430. Like the earlier-described embodiment, the PCB 60 is supported between the base 430 and the cover 10. In addition, the camera housing 404 protects the PCB 60 and the associated electronic components 64 from moisture and debris, and includes passive cooling features that permit reliable operation of the vehicle camera 400.

The base 430 illustrated in FIGS. 15-17 differs from the base 30 illustrated in FIGS. 1-4 in that the base 430 includes connection pins 446 that are supported in the blind openings provided in the bosses 40 and are used to secure the PCB 60 to the base endwall 37. In particular, the connection pins 446 are fixed within the bosses 40, and protrude toward the cover 10. The connection pins 446 are press-fit into openings 468 provided in the PCB 60, whereby the PCB is secured to the base 430.

The base 430 illustrated in FIGS. 15-17 further differs from the base 30 illustrated in FIGS. 1-4 in that the second end 14 of the cover sidewall 12 is secured to the base flange 32 via adhesive. As previously described, the cover 10 may include features that facilitate bonding of the cover 10 with the base 30 using an adhesive 447. The features include providing a housing surface that is optimized for bonding by having a relatively higher percentage of base material relative to filler material than portions of the housing adjacent the surface as shown in FIG. 3.

Referring to FIGS. 18-21, a method of manufacturing an electronics device housing includes method steps that provide structural elements of the device housing that have surfaces that are optimized for bonding to each other. In particular, the structural elements of the device housing may have a housing surface that has a relatively higher percentage of base material relative to filler material than portions of the housing adjacent the surface. In some embodiments, the method facilitates forming an assembly of a first element that is formed of one material and a second element that is formed of another material, in which the first element is connected to the second element in a predetermined configuration. The method will be described with respect to forming the vehicle camera housing 4 discussed above with respect to FIGS. 1-4.

The method includes providing the first element (step 500). In the illustrated embodiment, the first element corresponds to the cover 10. The first element is formed of TCP and has an original material structure (e.g., a material structure prior to heat treatment) corresponding to an original set of material properties.

In some embodiments, the first element is provided in an injection molding process. The first element is formed by injecting a first plastic material into a mold 600 having the shape of the cover 10.

The original material used to form the first element is a TCP that includes a base material and a filler material. For example, the base material is a conventional plastic such as PA66 and the filler material is a thermally conductive material such as graphite particles. In some embodiments, the filler material of the original material is uniformly distributed within the base material. Thus, the original material structure extends uniformly throughout a volume of a target portion of the first element, where the target portion is the portion of the first element that is to be bonded with a second element.

The amount of the filler material (e.g., graphite) within the original material is a first percentage of the total amount of material that forms the original material. In some embodiments, the first material structure results in a TCP that has a thermal conductivity of at least 1 W/mK. In other embodiments, the TCP has a thermal conductivity of at least 2 W/mK. In still other embodiments, the TCP has a thermal conductivity of at least 5 W/mK.

In a second step, the target portion of the first element is heat treated such that at least a portion of the outer surface of the target portion has a modified material structure corresponding to a modified set of material properties. In addition, other portions of the target portion retain the material structure and properties of the original material (step 502). Heat treatment of the target portion is achieved by providing heating elements 602 within the mold (injection tool) 600 at a location corresponding to the target area (FIG. 19). As a result, specific areas of the mold 600 have localized heating elements 602 near the surface of the target portion (FIG. 19). During heat treatment, the heating elements 602 are activated, which has the effect of pulling the base material (e.g., PA66) to the surface and reducing the amount of filler material (e.g., graphite) at the surface. Following heat treatment, the first element is allowed to cool, following which the resin rich surface is maintained.

In the cover 10, the target portion corresponds to the cover sidewall second end 14 that is to be laser welded to the base flange 32, which is also referred to as the housing portion 91 (see discussion above with respect to FIG. 3). Following heat treatment of the target portion, the housing portion 91 includes the surface portion 92 corresponding to an outer surface of the cover sidewall second end 14, the first portion of housing material 93 disposed adjoining the outer surface of the cover sidewall second end 14, and the second portion of housing material 94 disposed adjoining the first portion of housing material 93 (FIG. 20).

The surface portion 92 and the first portion of housing material 93 are formed of the modified material and have the modified set of material properties, whereas, the second portion of housing material 94 is formed of the original material having the original set of material properties. The amount of the filler material within the modified material is a second percentage of the total amount of material that forms the modified material. That is, the original thermally conductive plastic material and the modified thermally conductive plastic material have substantially the same components, but have different proportions of base material and filler material. In particular, the second percentage is less than the first percentage.

As a result, the original material retains the first set of material properties, whereas the modified material has a second set of material properties that are different from the those of the original set and correspond to the relatively lower amount of filler material disposed therein. Although the modified material is less thermally conductive than the original material due to its relatively lower amount of filler material, the relatively higher amount of base material within the modified material facilitates bonding with other types of plastic materials. Thus, bonding between two structural elements can be achieved more easily and reliably when compared to some conventionally formed TCP housings having a uniform distribution of base and filler materials.

Following the heat treating step, the method includes providing the second element (step 504). In this example, the second element is the base 30. The base 30 is formed of a conventional plastic material such as CBP. The base 30 is formed in an injection molding process or by other suitable techniques.

Next, the cover 10 and the base 30 are positioned so that the surface portion 92 of the cover 10 physically contacts the flange 32 of the base 30 (step 506). In particular, the cover second end 14 contacts the flange 32, whereby the cover 10 closes the open end of the base 30, forming the interior space 60.

Figure 21:
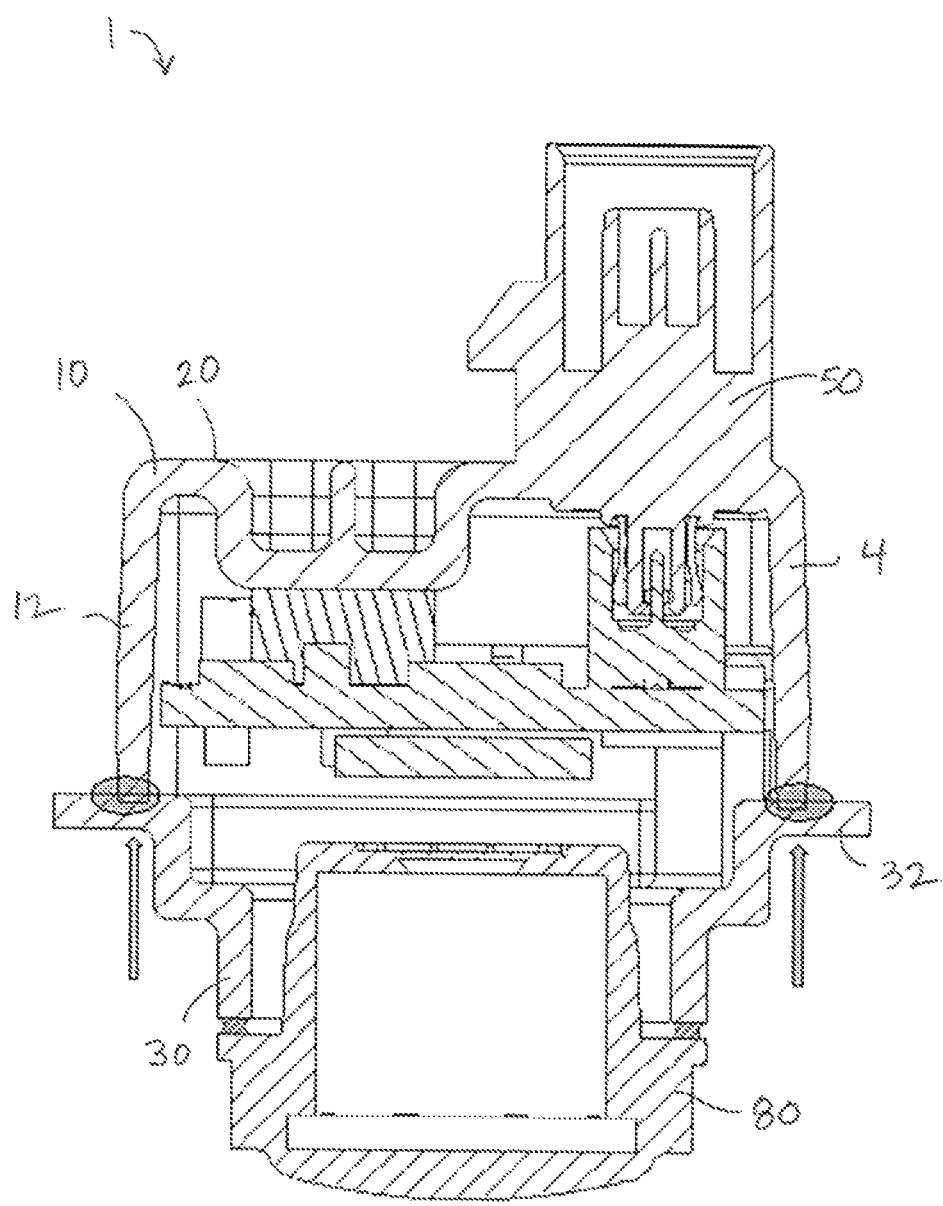
FIG. 21 is a cross sectional view of the vehicle camera of FIG. 1 illustrating the method step of forming a bond between the cover and the base using a laser welding process, the laser beam represented by arrows.

Once the cover 10 and base 30 have been positioned, a bond is formed between the surface portion 92 of the cover 10 and the flange 32 of the base 30 using a laser welding process (step 508). In the illustrated embodiment, the laser welding process is performed in such a way that a laser beam passes through the flange 32 to the surface portion 92 of the cover 10 (FIG. 21). By this procedure, the cover is joined to the flange 32 of the base 30 via the laser weld joint 18.

In the method described above, the cover 10 and the base 30 illustrated in FIGS. 1-4 and 18-20 are formed as separate elements and then joined via the laser welding process. For example, both the cover and the base may be formed in separate, single-shot injection molding processes, each having its own injection tool. In other embodiments, for example the embodiment illustrated in FIGS. 11-14, the bond between the seal 398 and the base 330 is formed by a multiple shot injection molding process in which the first element (e.g., the base 330) is formed via a first shot of material injection and the second element (e.g., the seal 398) is formed on the target region of the first element via a second shot of material injection.

Although the camera housing 4, including the base 30, the PCB 60 and the cover 10 are illustrated as having a rectangular shape when viewed in plan view, the base 30, the PCB 60 and the cover 10 are not limited to having a rectangular shape. For example, the base 30, the PCB 60 and the cover 10 may have another polygonal shape, an irregular shape including cut outs, or other shape as determined by the requirements of the application.

Selective illustrative embodiments of the system and device are described above in some detail. It should be understood that only structures considered necessary for clarifying the system and device have been described herein. Other conventional structures, and those of ancillary and auxiliary components of the system and device, are assumed to be known and understood by those skilled in the art. Moreover, while a working example of the system and device have been described above, the system and device are not limited to the working examples described above, but various design alterations may be carried out without departing from the system and device as set forth in the claims.

What is claimed is:

1. An electronic device comprising
a housing including a first housing portion, the first housing portion including
a first portion of an outer surface of the housing,
a first portion of housing material disposed adjoining the first portion of the outer surface, and
a second portion of housing material disposed adjoining the first portion of housing material, the first portion of housing material disposed between the second portion of housing material and the first portion of the outer surface,
wherein
the first portion of the outer surface and the first portion of housing material are formed of a first thermally conductive plastic material which comprises a first plastic material and a first filler material, wherein the amount of the first filler material within the first thermally conductive plastic material is a first percentage of the total amount of material that forms the first thermally conductive plastic material, and
the second portion of housing material is formed of a second thermally conductive plastic material that comprises the first plastic material and the first filler material, the amount of the first filler material within the second thermally conductive plastic material is a second percentage of the total amount of material that forms the second thermally conductive plastic material, and the second percentage is greater than the first percentage.

2. The electronic device of claim 1, wherein
the housing includes a sidewall that forms a closed section when viewed in cross-section and an endwall that closes a first end of the sidewall, and
the first housing portion is disposed at a second end of the sidewall, where the second end is opposed to the first end.

3. The electronic device of claim 2, wherein
the housing includes a base that is disposed at the second end and closes the second end, the base being joined to the first housing portion via a weld joint, where the weld joint is formed of the first thermally conductive plastic material.

4. The electronic device of claim 1, wherein
the housing includes a sidewall that forms a closed section when viewed in cross-section and an endwall that closes a first end of the sidewall, and
the first housing portion is disposed between the first end and a second end of the sidewall, where the second end is opposed to the first end.

5. The electronic device of claim 1, wherein
the housing includes a base, a cover and a sealed interior space that is defined between the base and the cover,
the cover includes a cover sidewall that forms a closed section when viewed in cross-section and a cover endwall that closes a first end of the cover sidewall,
the base is fixed to a second end of the cover sidewall,
the first housing portion is disposed at the second end of the cover sidewall, where the second end is opposed to the first end,
the electronic device includes a printed circuit board and a thermal interface device,
the printed circuit board is disposed in the interior space, the printed circuit board including a first surface that faces the cover, a second surface that is opposed to the first surface and faces the base, and an electronic element supported on one of the first surface and the second surface, and the thermal interface device is disposed in the interior space, the thermal interface device being formed of a thermal interface material having a thermal conductivity of at least 1 W/mK, and being disposed between the first surface and the housing such that the thermal interface device contacts the printed circuit board and a portion of the cover.

6. The electronic device of claim 5, wherein the portion of the cover is formed of the second thermally conductive plastic material, which has a thermal conductivity of at least 1 W/mK.

7. The electronic device of claim 5, wherein the base is formed of a laser transparent plastic material, the base is joined to the first housing portion via a weld joint, and the weld joint is formed of the first thermally conductive plastic material.

8. The electronic device of claim 5, wherein the portion of the cover includes a portion of the cover endwall that is surrounded by, and spaced apart from, a peripheral edge of the cover endwall, and the peripheral edge of the cover endwall is formed of a plastic material that is different than the thermally conductive plastic material.

9. The electronic device of claim 5, wherein the portion of the cover includes the cover sidewall and a portion of the cover endwall.

10. The electronic device of claim 5, wherein an outward facing surface of the portion of the cover includes a passive cooling feature that comprise a pair of depressions separated by a land.

11. The electronic device of claim 5, wherein the base includes
a base sidewall having a first end and a second end,
a flange disposed at the base sidewall first end, the flange extending outward from the base sidewall in a direction perpendicular to the base sidewall,
a base endwall disposed at the base sidewall second end, the base endwall extending inward from the base sidewall in a direction that is parallel to the flange, the base endwall having an opening, and
a collar that surrounds the opening and protrudes outward from the base endwall in a direction away from the flange.

12. The electronic device of claim 5 comprising an electrical connector that is supported on the cover, the electrical connector including
a connector housing, and
electrical conductors that are supported on the connector housing and are electrically connected to the printed circuit board,
wherein the connector housing is formed of a material that is different from the thermally conductive plastic material used to form the portion of the cover.

13. The electronic device of claim 5, wherein the electronic device is a camera and includes a lens assembly disposed in an opening in the base, and the electronic element is an image detector supported on the printed circuit board second surface so as to be aligned with an optical axis of the lens assembly.

14. A method of forming an assembly of a first element formed of a first material and a second element formed of a second material, in which the first element includes a target region, the method comprising providing the first element, the first element having an original material structure corresponding to an original set of material properties, the original material structure extending uniformly throughout at least a volume defined by the target region of the first element, heat treating the target region of the first element such that at least a portion of the outer surface of the target region has a modified material structure corresponding to a modified set of material properties and other portions of the target region retain the material properties corresponding to the original set of material properties, the modified set of material properties being different from the original material properties, providing the second element, positioning the first element and the second element so that the portion of the outer surface of the target region of the first element physically contacts the second element while in a predetermined configuration, forming a bond between the portion of the outer surface of the target region of the first element and the second element, whereby the second element is connected to the first element in the target region and in the predetermined configuration.

15. The method of claim 14 wherein the bond is formed by performing a laser welding process.

16. The method of claim 15 wherein the laser welding process includes performing laser welding including passing a laser beam through the second element to the first element.

17. The method of claim 15 wherein the first element comprises a housing that includes a first housing portion,
prior to the heat treating step, the first housing portion includes the original set of material properties extending uniformly throughout at least the volume defined by the target region, and
following the heat treating step, the target region includes
a portion of an outer surface of the housing,
a first portion of housing material disposed adjoining the portion of the outer surface, and
a second portion of housing material disposed adjoining the first portion of housing material, the first portion of housing material disposed between the second portion of housing material and the portion of the outer surface,
wherein
the portion of the outer surface and the first portion of housing material are formed of a first thermally conductive plastic material which comprises a first plastic material and a first filler material, wherein the amount of the first filler material within the first thermally conductive plastic material is a first percentage of the total amount of material that forms the first thermally conductive plastic material, and
the second portion of housing material is formed of a second thermally conductive plastic material that comprises the first plastic material and the first filler material, the amount of the first filler material within the second thermally conductive plastic material is a second percentage of the total amount of material that forms the second thermally conductive plastic material, and the second percentage is greater than the first percentage.

18. The method of claim 14 wherein the bond is formed by a multiple shot injection molding process in which the first element is formed via a first shot of material injection and the second element is formed on the first element in the target region via a second shot of material injection.

19. The method of claim 14, wherein the first material and the second material are thermally conductive plastic materials having a thermal conductivity of at least 1 W/mK.

20. The method of claim 14, wherein the first material and the second material are formed of the same constituents and differ only in the ratio of amounts of the first plastic material to the first filler material.

* * * * *